United States Patent
Hisano et al.

(10) Patent No.: US 10,392,703 B2
(45) Date of Patent: Aug. 27, 2019

(54) PLASMA CVD APPARATUS

(71) Applicant: TOYOTA JIDOSHA KABUSHIKI KAISHA, Toyota-shi (JP)

(72) Inventors: Hirohiko Hisano, Toyota (JP); Masafumi Koizumi, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 269 days.

(21) Appl. No.: 15/126,962

(22) PCT Filed: Mar. 16, 2015

(86) PCT No.: PCT/JP2015/057760
§ 371 (c)(1),
(2) Date: Sep. 16, 2016

(87) PCT Pub. No.: WO2015/141641
PCT Pub. Date: Sep. 24, 2015

(65) Prior Publication Data
US 2017/0096737 A1  Apr. 6, 2017

(30) Foreign Application Priority Data
Mar. 20, 2014 (JP) .................. 2014-058890

(51) Int. Cl.
*C23C 16/00* (2006.01)
*C23C 16/50* (2006.01)
(Continued)

(52) U.S. Cl.
CPC ............ *C23C 16/50* (2013.01); *C23C 16/455* (2013.01); *H01J 37/32541* (2013.01);
(Continued)

(58) Field of Classification Search
CPC .............................................. H01J 37/32577
(Continued)

(56) References Cited

U.S. PATENT DOCUMENTS 2,583,898 A * 1/1952 Smith ................ B01J 19/088
204/168
3,180,816 A * 4/1965 Horst ................ B01J 19/088
422/186.04
(Continued)

FOREIGN PATENT DOCUMENTS

JP  10-280145 A  10/1998
JP  2004-11021 A  1/2004
(Continued)

OTHER PUBLICATIONS

International Search Report dated Jun. 9, 2015 in PCT/JP15/057760 filed Mar. 16, 2015.

*Primary Examiner* — Keath T Chen
(74) *Attorney, Agent, or Firm* — Oblon, McClelland, Maier & Neustadt, L.L.P.

(57) ABSTRACT

A plasma CVD apparatus is provided. The plasma CVD apparatus includes: a chamber forming a plasma space; and a power introduction terminal arranged in a terminal insertion hole that extends through a wall of the chamber. The power introduction terminal includes an insulator having a through hole and a rod-like electrical conductor inserted in the through hole. One end of the conductor is arranged in the chamber and the other end of the conductor is electrically connected to a power source that supplies power into the chamber. A gap between an inner wall of the insulator and the rod-like electrical conductor is less than 2 mm. A distance from one end of the insulator, which is arranged in the plasma space inside the chamber, to a contact point between the insulator and the conductor is greater than 10 mm.

1 Claim, 7 Drawing Sheets

(51) Int. Cl.
*H05H 1/46* (2006.01)
*H01J 37/32* (2006.01)
*C23C 16/455* (2006.01)

(52) U.S. Cl.
CPC .. *H01J 37/32577* (2013.01); *H01J 37/32908* (2013.01); *H05H 1/46* (2013.01); *H01J 37/32724* (2013.01); *H01J 2237/3321* (2013.01); *H05H 2245/123* (2013.01)

(58) Field of Classification Search
USPC ..................................................... 118/723 E
See application file for complete search history.

(56) References Cited

U.S. PATENT DOCUMENTS

| | | | | |
|---|---|---|---|---|
| 5,941,647 A * | 8/1999 | Koike | ................... | B23B 13/125 279/46.3 |
| 6,117,496 A * | 9/2000 | Sugiyama | ........... | C23C 16/0281 427/237 |
| 2002/0039007 A1* | 4/2002 | Yamamoto | ............ | H01J 29/085 315/160 |
| 2003/0056724 A1* | 3/2003 | Wada | ....................... | C23C 14/50 118/500 |
| 2007/0194039 A1* | 8/2007 | Singh | ................ | H01J 37/32082 222/3 |
| 2009/0159440 A1* | 6/2009 | Toyoda | ................. | C23C 16/452 204/298.07 |
| 2011/0024044 A1* | 2/2011 | Nagakubo | ........... | H01J 37/3244 156/345.33 |

FOREIGN PATENT DOCUMENTS

| | | |
|---|---|---|
| JP | 2005-5236 A | 1/2005 |
| JP | 2009-144223 A | 7/2009 |
| JP | 2012-4495 A | 1/2012 |
| WO | 2010/008076 A1 | 1/2010 |

* cited by examiner

Fig. 7

|  | WITHOUT LABYRINTH | WITH LABYRINTH |
| --- | --- | --- |
| NUMBER OF CYCLES BEFORE GENERATION OF ABNORMAL ELECTRICAL DISCHARGE | 8,000 CYCLES | 20,000 CYCLES OR MORE |

PLASMA CVD APPARATUS

TECHNICAL FIELD

The present invention relates to a plasma CVD apparatus.

BACKGROUND ART

Conventionally, in manufacturing processes of, for example, semiconductor devices, a plasma film formation step or a plasma etching step using plasma has been employed in order to achieve higher definition and thinner films. Such steps are performed using a plasma processing apparatus.

Plasma processing using a plasma processing apparatus is generally performed by generating plasma within a vacuum processing chamber (chamber). In order to generate the plasma, the plasma processing apparatus is provided with a power introduction terminal (a current introduction terminal) for introducing power (a current) into the chamber. By introducing power (a current) into the chamber from an external power source via such power introduction terminal, gas inside the chamber can be turned into plasma.

Examples of conventional plasma processing apparatuses and power introduction terminals include those disclosed in, for example, Patent Document 1 below. The power introduction terminal disclosed in Patent Document 1 includes: an insulator having one end attached in a terminal insertion hole formed through a wall of a chamber and the other end on the opposite side of said one end; and a rod-like electrical conductor inserted in a through hole formed through the insulator.

CITATION LIST

Patent Document

Patent Document 1: JP2012-004495 A

SUMMARY

Technical Problem

In the plasma CVD apparatus including the power introduction terminal disclosed in Patent Document 1 above has a problem in which, electrons are charged at the insulator included in the power introduction terminal and the charged electrons facilitates electrical discharge, which results in abnormal electrical discharge (arc discharge). Such charging of electrons is particularly likely to occur at a contact point between the insulator and the rod-like electrical conductor and if the electrons are charged at such contact point, abnormal electrical discharge becomes particularly likely to occur. Although Patent Document 1 discloses a power introduction terminal addressed to a higher temperature environment and a higher power apparatus, it does not disclose a technical idea of suppressing such abnormal electrical discharge (arc discharge).

The inventors have found, for the purpose of solving the above-mentioned problem of abnormal electrical discharge, arranging the contact point between the insulator and the rod-like electric conductor, i.e., a portion which is particularly likely to be subjected to charging, so as to be away from a plasma space where plasma is generated in the chamber.

However, with the recent needs for larger plasma processing apparatuses and faster plasma processing in order to improve productivity, and the resulting increase in a required power (voltage), abnormal electrical discharge may still occur even if the portion which is likely to be subjected to charging is at a position away from the plasma space. Under the recent circumstances in which higher voltage is required, it is insufficient to arrange the portion which is likely to be subjected to charging at a position away from the plasma space and a problem still remains unsolved in terms of suppressing abnormal electrical discharge.

The present invention has been made in light of such problem and an object of the present invention is to provide a plasma CVD apparatus capable of suppressing the generation of abnormal electrical discharge even when a high voltage is used.

Solution to Problem

In order to solve the above problem, a plasma CVD apparatus according to the present invention comprises: a chamber forming a plasma space; and a power introduction terminal arranged in a terminal insertion hole that extends through a wall of the chamber, wherein: the power introduction terminal includes an insulating member having a through hole and an electrical conductor inserted in the through hole; one end of the electrical conductor is arranged in the chamber and the other end of the electrical conductor is electrically connected to a power source that supplies power into the chamber; a gap between an inner wall of the insulating member and the electrical conductor is less than 2 mm; and a distance from said one end of the insulating member, said one end being arranged in the plasma space inside the chamber, to a contact point between the insulating member and the electrical conductor is greater than 10 mm.

In the power introduction terminal used for the plasma CVD apparatus in the present invention, since the gap between the inner wall of the insulating member and the electrical conductor is formed so as to be smaller than a predetermined value, the entry of an electrical field (electric lines of force) from such gap can be suppressed. Since plasma is generated where an electrical field exists, the suppression of entry of the electrical field from the gap leads to suppression of the generation of plasma in the vicinity of the contact point between the insulating member and the electrical conductor. As a result, it is possible to suppress the generation of abnormal electrical discharge resulting from the charging of electrons at the contact point. Furthermore, since the distance from the end of the insulating member (which is arranged in the plasma space inside the chamber) to the contact point between the insulating member and the electrical conductor is set so as to be greater than another predetermined value, the contact point can be located away from the plasma space inside the chamber. In this way, since the contact point can be made to be less likely to be exposed to the plasma space in the chamber, it is possible to suppress the charging of electrons at the contact point even when a high voltage is used. As a result, the generation of abnormal electrical discharge can be suppressed.

In the plasma CVD apparatus according to the present invention, the contact point is preferably provided at a position out of an area that opposes the plasma space.

In the plasma CVD apparatus according to the present invention, it is preferable that: the electrical conductor includes a projected part that is provided so as to be projected from a surface of the electrical conductor, the projected part being in contact with the inner wall of the insulating member; the inner wall of the insulating member is provided with a recessed part that is formed by recessing part of the inner wall; and in a portion at which the projected part and the inner wall of the insulating member are in contact with each other, a contact point between the projected part formed inside the chamber and the insulating member is located in the recessed part.

In the plasma CVD apparatus according to the present invention, by forming the electrical conductor and the insulating member so as to be bent, the contact point is preferably provided at the position out of the area that opposes the plasma space.

Advantageous Effects of Invention

The present invention can provide a plasma CVD apparatus capable of suppressing the generation of abnormal electrical discharge even when a high voltage is used.

BRIEF DESCRIPTION OF DRAWINGS

FIG. 7 is a table illustrating the number of cycles performed before an abnormal electrical discharge was generated when plasma CVD processing was performed.

DESCRIPTION OF EMBODIMENTS

Figure 1:
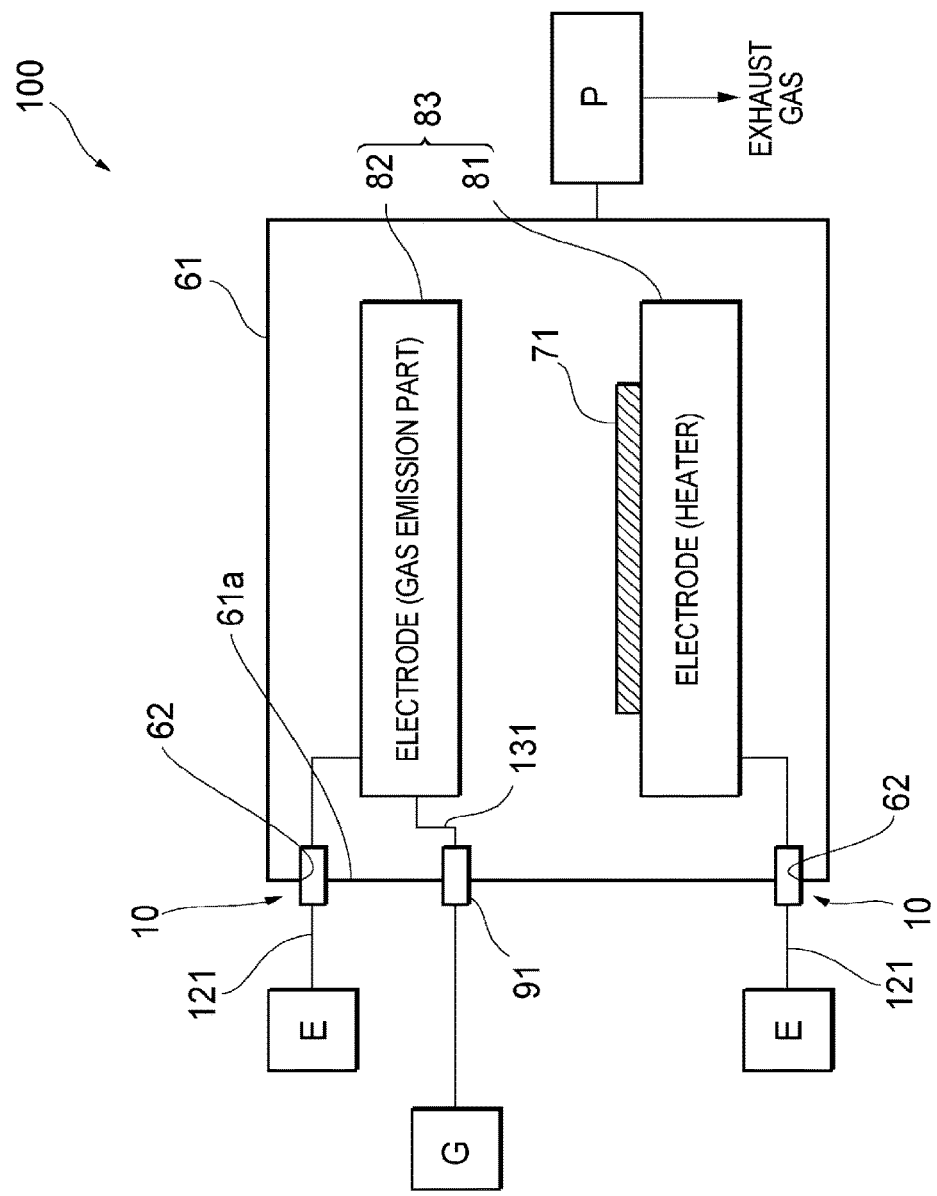
FIG. 1 is a schematic configuration diagram showing a plasma CVD apparatus according to an embodiment of the present invention.

An embodiment of the present invention will now be described with reference to the attached drawings. In order to facilitate understanding, the same components are denoted by the same reference numerals wherever possible, and redundant descriptions thereof will be omitted.

First, a plasma CVD apparatus 100 according to an embodiment of the present invention will be described with reference to FIG. 1. FIG. 1 is a schematic configuration diagram showing the plasma CVD apparatus 100. The plasma CVD apparatus 100 applies a voltage to a source gas to turn it into plasma and forms a thin film on a surface of a substrate placed in a vacuum processing chamber. It should be noted that the present invention is not limited to the plasma CVD apparatus 100 in the present embodiment.

As shown in FIG. 1, the plasma CVD apparatus 100 includes a sealable chamber 61, a gas introduction part 91 for introducing a reactant gas into the chamber 61, a pump P for exhausting the reactant gas from the chamber 61, an electrical discharge part 83 constituted by a pair of a cathode electrode 81 and an anode electrode 82 (hereinafter simply referred to as "the electrode(s)" where the context allows) that are arranged in the chamber 61 and cause plasma discharge therebetween, power sources E for supplying power to the electrical discharge part 83, power introduction terminals 10 (current introduction terminals) electrically connected to the respective electrodes 81 and 82, and power introduction wires 121 (current introduction wires) for electrically connecting the power sources E to the power introduction terminals 10. A substrate 71 is placed on the cathode electrode 81.

The chamber 61 is a box-like airtight container formed of aluminum or an aluminum alloy. The chamber 61 is provided with an inlet/outlet port (not shown) for carrying in and out the substrate 71 and having a shutter mechanism. The chamber 61 is also provided with a support table (not shown) that supports the cathode electrode 81 and the anode electrode 82 with a predetermined distance therebetween, and the pump P is connected to a wall 61a of the chamber 61 to vacuum the chamber 61 to a predetermined degree of vacuum.

The anode electrode 82 is made of a metal material such as stainless steel and an aluminum alloy. The anode electrode 82 has a hole inside and its plasma discharge surface, which faces the opposing cathode electrode 81, is provided with a large number of through holes (not shown) having conduction to the hole. The dimension of the anode electrode 82 is set to an appropriate value suitable for the dimension of the substrate 71 on which a thin film is to be formed and designed so as to be substantially the same as the dimension of the cathode electrode 81. The anode electrode 82 is grounded.

An end surface of the anode electrode 82 is connected to the gas introduction part 91 via a gas introduction pipe 131 and the gas introduction part 91 is connected to a gas supply source G. Accordingly, the reactant gas supplied from the gas supply source G is supplied to the inside of the anode electrode 82 via the gas introduction part 91 and the gas introduction pipe 131 and the reactant gas is uniformly sprayed from the large number of through holes formed in the anode electrode 82 onto the surface of the substrate 71 held by the cathode electrode 81.

The reactant gas (source gas) to be supplied to the substrate 71 for film formation is preferably a reactant gas that causes an electrically conductive film to be formed on the substrate 71 and, for example, a hydrocarbon gas may be used.

The cathode electrode 81 has a heater inside and allows the substrate 71 to be placed on a side surface facing the counterpart anode electrode 82 to thereby heat the substrate 71 during the film formation by plasma discharge. The cathode electrode 81 is made of a material having electrical conductivity and heat resistance, such as stainless steel, an aluminum alloy, carbon, etc. Although the heater is incorporated in the cathode electrode 81 in the present embodiment, the configuration is not limited thereto and the heater and the cathode electrode 81 may be located separately. It should be noted that, although the substrate 71 is typically a glass substrate or a semiconductor substrate, it is not particularly limited thereto.

Although the anode electrode 82 and the cathode electrode 81 are provided on one by one basis in FIG. 1, the plasma processing apparatus to which the power introduction terminal of the present embodiment is applicable is not limited thereto, and as one example of a modification of FIG. 1, the apparatus may be configured such that one anode electrode 82 and two cathode electrodes 81 are provided. In addition, without being limited to the configuration in which the anode electrode 82 and the cathode electrode 81 are provided in a horizontal manner, the present invention is also applicable to a plasma processing apparatus in which these electrodes are provided in a perpendicular manner.

The pump P is connected to the chamber 61 and is a vacuum pump capable of decompressing the chamber 61.

By adjusting the exhaust of gas by the vacuum pump, the pressure inside the chamber 61 can be adjusted to a predetermined level. The present embodiment assumes adjusting the pressure inside the chamber 61 during the film formation process to, for example, 10 Pa.

The power source E may be, for example, a bias power source, and the types of the bias power source may include a DC power source, an AC power source, a high-frequency power source, a microwave power source, etc. The power source E is electrically connected to the power introduction terminal 10 attached to the wall 61a of the chamber 61 and the power source E can supply a high voltage bias, etc. into the chamber 61 via the power introduction terminal 10. The bias power source may be a power source capable of supplying a high voltage bias of, for example, 1000 V or higher into the chamber 61. In addition, the bias power source may be a power source capable of supplying, into the chamber 61, a predetermined direct current or mainly supplying a direct current with an alternate current, a high-frequency current, a microwave current, etc., superimposed thereon.

The power introduction wire 121 electrically connects an end ("the other end 11b" to be described later) of the power introduction terminal 10, which is projected outside from the chamber 61, to the power source E and the power supplied from the power source E is supplied to the electrical discharge part 83 arranged inside the chamber 61 via the power introduction wire 121 and the power introduction terminal 10. The power introduction wire 121 is preferably accommodated in an accommodation case (not shown) having a function of blocking the power from leaking outside.

Figure 2:
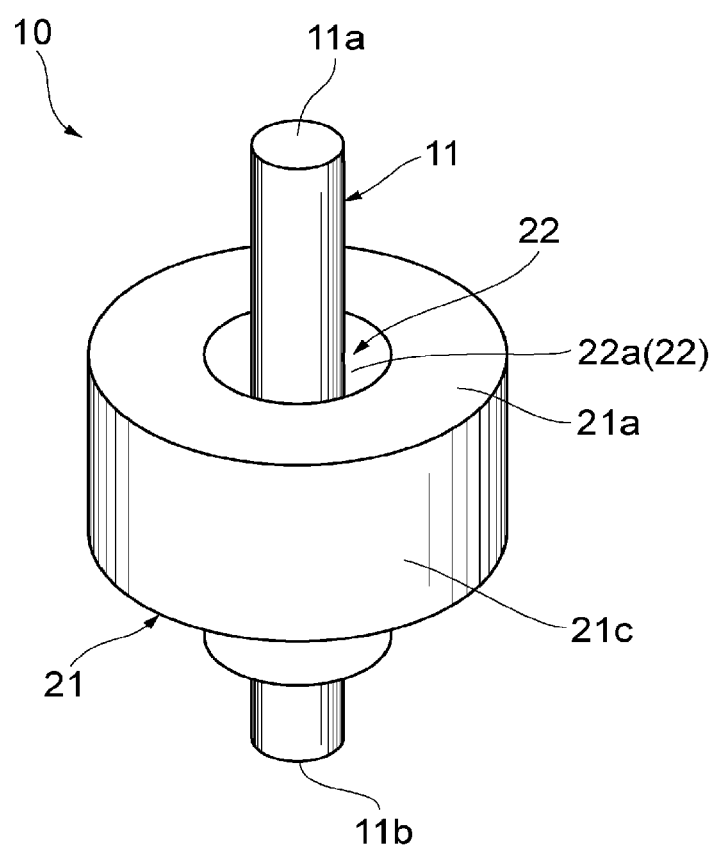
FIG. 2 is a schematic configuration diagram showing a power introduction terminal.
Figure 3:
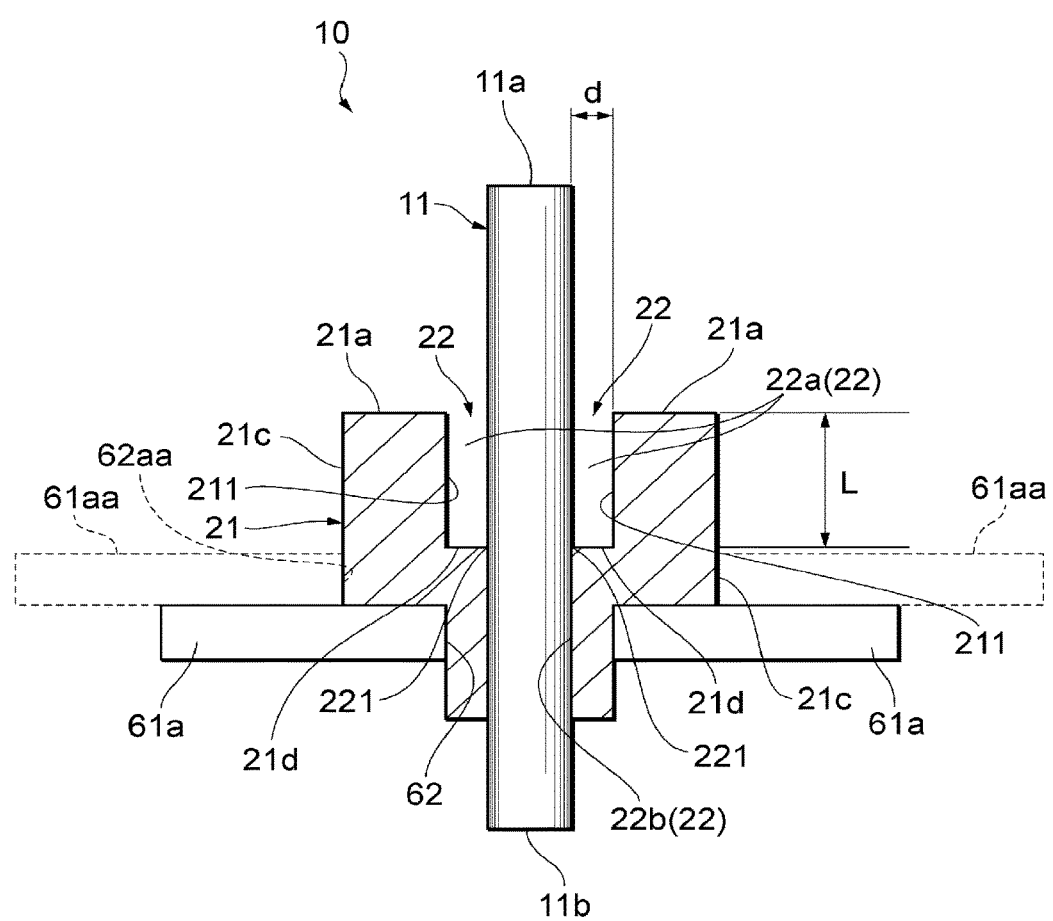
FIG. 3 is a cross-sectional view schematically showing a structure of the power introduction terminal.

Now, the power introduction terminal 10 provided in the plasma CVD apparatus 100 will further be described with reference to FIGS. 2 and 3. FIG. 2 is a schematic configuration diagram showing the power introduction terminal 10. FIG. 3 is a schematic cross-sectional view of FIG. 2. The power introduction terminal 10 shown in FIGS. 2 and 3 is arranged so as to be fixed in the terminal insertion hole 62 that extends through the wall 61a of the chamber 61, as shown in FIG. 1.

As shown in FIG. 2, the power introduction terminal 10 includes a rod-like electrical conductor 11 for introducing power into the chamber 61 and an insulator 21 (insulating member) that covers the rod-like electrical conductor 11.

The rod-like electrical conductor 11 is a columnar rod (electrode) having one end 11a inserted into a through hole 22 of the insulator 21 and the other end 11b electrically connected to the power source E shown in FIG. 1 via the power introduction wire 121. The rod-like electrical conductor 11 is formed of a metallic material containing, for example, copper, aluminum, nickel, silver, gold, etc. Since the rod-like electrical conductor 11 is provided as described above, the power supplied from the power source E is supplied to the electrical discharge part 83 inside the chamber 61 via the power introduction wire 121 and the rod-like electrical conductor 11.

As shown in FIGS. 2 and 3, the insulator 21 is a substantially cylindrical member provided so as to surround the rod-like electrical conductor 11. The insulator 21 is formed of an insulating material such as ceramics and fixed (using, for example, a heat-resistance adhesive) in the terminal insertion hole 62 that extends through the wall 61a of the chamber shown in FIG. 1. Thus, the insulator 21 insulates the rod-like electrical conductor 11 from the wall 61a of the chamber 61. It should be noted that, although the insulator 21 is formed in a substantially cylindrical manner in the present embodiment, the insulator 21 is not limited thereto and the insulator 21 may have a variety of shapes and sizes, as long as it has a function of insulating the rod-like electrical conductor 11 from the wall 61a of the chamber 61.

An end surface 21a of the insulator 21, which is located inside the chamber 61 (an end facing the plasma space) will now be described. As discussed above, the insulator 21 is fixed in the terminal insertion hole 62 that extends through the wall 61a of the chamber 61 shown in FIG. 1. More specifically, the insulator 21 is fixed in the terminal insertion hole 62 with the end surface 21a of the insulator 21, which is located inside the chamber 61 (not shown in FIG. 3) being projected into the chamber 61 from the terminal insertion hole 62 that extends through the wall 61a of the chamber 61. Thus, at least the above-mentioned end surface 21a of the insulator 21 is exposed to plasma generated in the chamber 61 during plasma CVD processing.

In the present embodiment, the power introduction terminal 10 is fixed in an airtight manner in the terminal insertion hole 62 in the wall 61a shown by the solid line in FIG. 3 (the wall of the chamber 61 in FIG. 1). However, the configuration is not limited thereto and may be selected as appropriate; for example, the power introduction terminal 10 may be fixed in an airtight manner in a terminal insertion hole 62aa in a wall 61aa shown by the dashed line in FIG. 3.

Next, the structure of the insulator 21 will further be described. As shown in FIGS. 2 and 3, the insulator 21 is provided with the stepped through hole 22 at the center thereof in order to allow the rod-like electrical conductor 11 to be inserted therein. The through hole 22 is constituted by a larger-diameter through hole 22a that allows the rod-like electrical conductor 11 to be inserted with a gap d therebetween and a smaller-diameter through hole 22b that is in contact with the rod-like electrical conductor 11 to hold the rod-like electrical conductor 11.

The gap d will be further described below. As discussed above, the larger-diameter through hole 22a is formed at the center of the insulator 21 so as to allow the rod-like electrical conductor 11 to be inserted with a predetermined gap d therebetween. In other words, the gap d is formed between an inner peripheral surface of the larger-diameter through hole 22a (an inner wall surface 211 of the insulator 21) and the rod-like electrical conductor 11. In the present embodiment, the gap d is set to a value greater than 0.2 mm and less than 2.0 mm. Since the gap d of 0.2 mm or less would cause clogging of the larger-diameter through hole 22a due to a film deposited onto the inner wall surface 211, a lower limit is preferably set for the gap d, as described above.

A contact point 221 at which the insulator 21 and the rod-like electrical conductor 11 are in contact with each other will now be described. As discussed above, the rod-like electrical conductor 11 is inserted in the smaller-diameter through hole 22b and the rod-like electrical conductor 11 is in contact with the inner peripheral surface of the smaller-diameter through hole 22b. An end located inside the chamber 61 (on an upper side in FIG. 3) in a contact surface between the smaller-diameter through hole 22b and the rod-like electrical conductor 11, in other words, an end located inside the chamber 61 in a portion at which the insulator 21 and the rod-like electrical conductor 11 are in contact with each other, is referred to as a contact point 221.

Next, a distance L from the above-mentioned contact 221 to the end surface 21a of the insulator 21 will be described. The distance L from the contact point 221 to the end surface 21a of the insulator 21, which is located inside the chamber 61 (an upper end surface of the insulator 21 in FIG. 3), is set to a value greater than 10 mm. Preferably, the distance L is set to a value greater than 10 mm and less than 1,000 mm. The distance L of 1,000 mm or greater would increase the size of the power introduction terminal 10 or require a high working accuracy, an upper limit is preferably set for the distance L, as described above.

As discussed above, the insulator 21 is provided with the stepped through hole 22 (the larger-diameter through hole 22a and the smaller-diameter through hole 22b) surrounding the rod-like electrical conductor 11. In the present embodiment, the insulator 21 located on the inner side of the chamber 61 (on the upper side in FIG. 3) with respect to the contact point 221 is spaced apart from the rod-like electrical conductor 11 by the gap d and extends from the contact point 221 by the distance L.

Now, a creepage distance of the insulator 21 will be described with reference to FIG. 3. The creepage distance of the insulator 21 is represented by the summed distance of the length of a side surface 21c of the insulator 21, the length of the end surface 21a of the insulator 21, the length of the inner wall surface 211 of the insulator 21 and the length of a bottom surface 21d of the larger-diameter through hole of the insulator 21, in a cross-sectional view of the insulator 21. When the plasma CVD processing is performed, a surface of the insulator 21 may suffer from a deposit of an electrically conductive film which is intended to be formed on the substrate 71. If such electrically conductive film is deposited onto the surface of the insulator 21, the insulation performance of the insulator 21 will be degraded, which may cause the leakage of current along the surface of the insulator 21. In order to suppress such leakage of current, a sufficient creepage distance of the insulator 21 has to be secured. In the present embodiment, since a sufficient creepage distance of the insulator 21 is secured, it is possible to suppress the leakage of current along the surface of the insulator 21.

Figure 4:
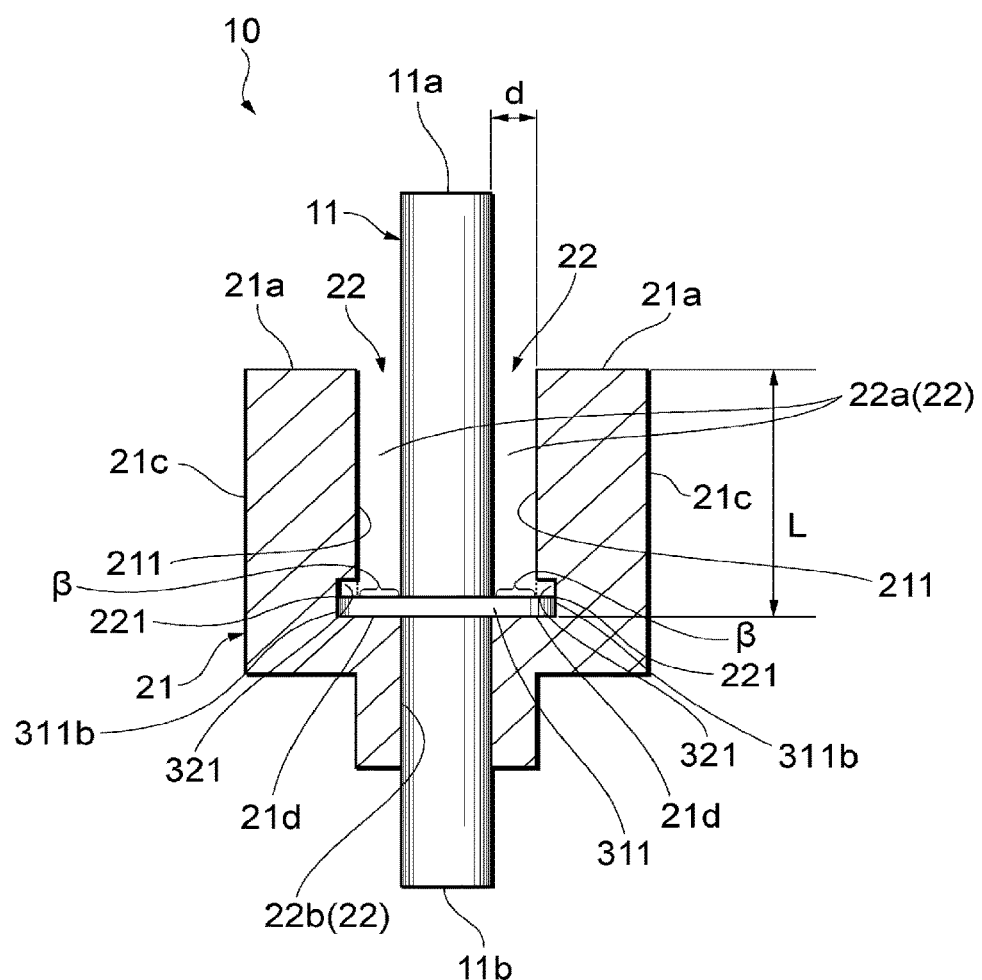
FIG. 4 is a cross-sectional view schematically showing a structure of a power introduction terminal according to a first modification.
Figure 5:
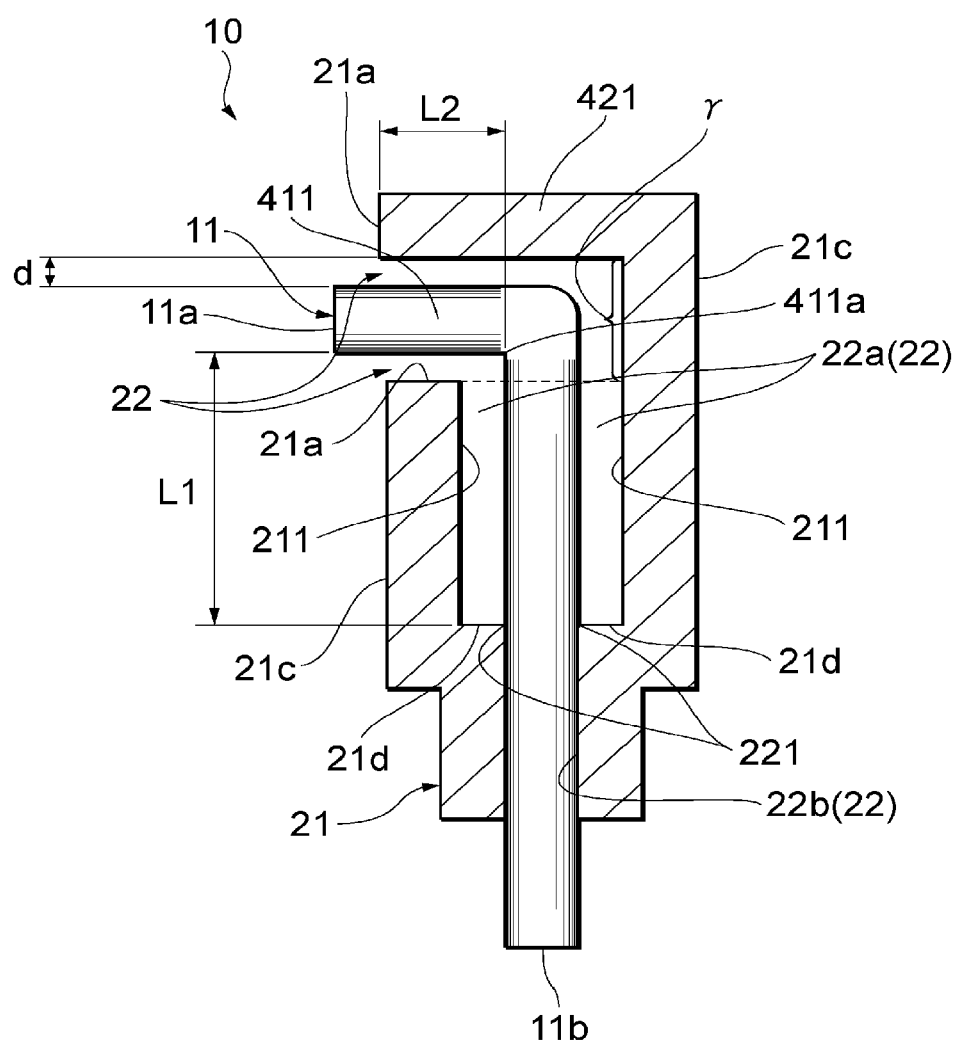
FIG. 5 is a cross-sectional view schematically showing a structure of a power introduction terminal according to a second modification.

Next, a power introduction terminal 10 in the modifications will be described below with reference to FIGS. 4 and 5. FIG. 4 is a cross-sectional view schematically showing a structure of a power introduction terminal 10 according to a first modification. FIG. 5 is a cross-sectional view schematically showing a structure of a power introduction terminal 10 according to a second modification. The power introduction terminals 10 shown in FIGS. 4 and 5 each have differences in the shapes of the rod-like electrical conductor 11 and the insulator 21 from those of the above-mentioned power introduction terminal 10 and the other configurations and functions are the same as those of the above-mentioned power introduction terminal 10. Accordingly, the same reference numerals are used for the same components as those used for the above-mentioned power introduction terminal 10, and the description thereof will be omitted.

The structure of the power introduction terminal 10 in the first modification shown in FIG. 4 will now be described. The inner wall surface 211 of the insulator 21 (the inner peripheral surface of the larger-diameter through hole 22a) in the first modification is provided with a bent part that is bent at a right angle at two portions from one end toward the other end. Specifically, in the first modification, the inner wall surface 211 of the insulator 21 is provided with a recessed part 321 formed by recessing a portion of the inner wall surface 211 on a side located farther away from the plasma space (a lower portion of the inner wall surface 211 in FIG. 4). In addition, in the first modification, the rod-like electrical conductor 11 includes a projected part 311 provided so as to be projected from a surface of the rod-like electrical conductor 11 toward the inner wall surface 211 (in the horizontal direction in FIG. 4) and an outer edge 311b of the projected part 311 is in contact with the inner wall surface 211. In such contact portion, a contact point 221, located inside the chamber 61 (see FIG. 1), between the outer edge 311b of the projected part 311 and the insulator 21 is located in the recessed part 321. In this way, in the power introduction terminal 10 shown in FIG. 4, the contact point 221 is provided at a position out of an area opposing the plasma space in the chamber 61 (an area β in the projected part 311 in FIG. 4). It should be noted that, although the projected part 311 is preferably formed of the same material as that of the rod-like electrical conductor 11, the material, shape, size, etc. of the projected part 311 may be selected in various ways.

As described above, since the contact point 221 is located in the recessed part 321 having a recessed shape in the inner wall surface 211 of the insulator 21, in other words, since the contact point 221 is provided at a position out of the area β that opposes the plasma space in the chamber 61, it is possible to further suppress the entry of an electric field via the gap d between the rod-like electrical conductor 11 and the insulator 21. As a result, it is possible to further suppress plasma reaching the contact point 211 via the gap d and therefore further suppress abnormal electrical discharge resulting from the charging of electrons at the contact point 221. In addition, while the depositing of an electrically conductive film proceeds in the area that opposes the plasma space in the chamber 61 (an area including the bottom surface 21d in FIG. 3) by performing the plasma processing in the power introduction terminal 10 in FIG. 3, the depositing of an electrically conductive film proceeds in the area β that opposes the plasma space in the projected part 311 in the power introduction terminal 10 shown in FIG. 4. On the other hand, at least the depositing of the electrically conductive film onto the recessed part 321 formed in the inner wall surface 211 is suppressed. As a result, it is possible to further suppress the leakage of current from the contact point 221 along the conductive film deposited onto the surface of the insulator 21 in the power introduction terminal 10 shown in FIG. 4, as compared to the situation with the power introduction terminal 10 shown in FIG. 3.

The structure of the power introduction terminal 10 in the second modification shown in FIG. 5 will now be described. The rod-like electrical conductor 11 and the inner wall surface 211 (the inner peripheral surface of the large-diameter through hole 22a) of the insulator 21 in the second modification are each provided with a bent part that is bent at a right angle at one portion from one end toward the other end. More specifically, the rod-like electrical conductor 11 is provided with a bent part 411 in which a portion located on an inner side of the chamber 61 (the left side in FIG. 5) in the rod-like electrical conductor 11 is bent. The insulator 21 is provided with a bent part 421 in which a portion located on the inner side of the chamber 61 (the left side in FIG. 5) in the insulator 21 is bent. As shown in FIG. 5, by forming the rod-like electrical conductor 11 and the insulator 21 so as to be bent, the contact point 221 between the rod-like electrical conductor 11 and the insulator 21 can be located out of an area γ that opposes the plasma space in the chamber 61 (see FIG. 1).

The distance L, which has been described above with reference to FIG. 3 (the distance from the contact point 221 to the end surface 21a of the insulator 21), is represented, in the second modification, by the sum of L1 and L2 shown in FIG. 5. That is to say, in the second modification, the distance L is represented by the sum of a distance (L1) from the contact point 221 to the bent part 411 of the rod-like electrical conductor 11 and a distance (L2) from a bent point 411a of the rod-like electrical conductor 11 to the end surface 21a of the insulator 21 which is located in the chamber 61 (the end facing the plasma space).

Since the contact point 221 is provided at a position out of the area γ that opposes the plasma space by forming the rod-like electrical conductor 11 and the insulator 21 so as to be bent as shown in FIG. 5, it is possible to further suppress an electrical field reaching the contact point 221 via the gap between the rod-like electrical conductor 11 and the insulator 21. Since plasma is generated in a location where an electrical field exists, by suppressing the entry of an electrical field as described above, it is possible to suppress the generation of plasma in the vicinity of the contact point 221. As a result, it is possible to further suppress the generation of abnormal electrical discharge resulting from the charging of electrons at the contact point 221. Furthermore, although the depositing of an electrically conductive film onto the area γ that opposes the plasma space proceeds as discussed above, the contact point 221 is provided at a position out of the area γ that opposes the plasma space and at least the depositing of the electrically conductive film onto the vicinity of the contact point 221 can be suppressed. As a result, it is possible to suppress the leakage of current from the contact point 221 along the electrically conductive film deposited on the surface of the insulator 21.

Although FIGS. 4 and 5 describe the examples in which the power introduction terminal 10 is installed with the gap between the rod-like electrical conductor 11 and the insulator 21 being oriented in a horizontal manner, such installation with the horizontally-oriented gap may cause the following problem. Specifically, film residues (not shown) produced in the chamber 61 as a result of plasma processing may drop onto the power introduction terminal 10 and thereby cause a short circuit between the rod-like electrical conductor 11 and the insulator 21. The reason for the occurrence of such short circuit will be described below.

If the size of the film residues from the chamber 61 is larger than, for example, the gap d between the rod-like electrical conductor 11 and the insulator 21, the film residues will be deposited so as to span the rod-like electrical conductor 11 and the insulator 21. If the deposited film residues are electrically conductive, a bias voltage will be applied to the film residues through the rod-like electrical conductor 11 and a short circuit will occur at a contact point between the film residues and the insulator 21. Even if the film residues are of an insulating type, the film residues will still be in contact with the rod-like electrical conductor 11 to which the bias voltage is applied, the contact point between the rod-like electrical conductors 11 and the insulating film residues will be exposed to plasma, and a short circuit will therefore occur.

In order to prevent the occurrence of the above-mentioned short circuit, it is preferable for the power introduction terminal 10 to be installed with the gap between the rod-like electrical conductor 11 and the insulator 21 being oriented in a downward manner. By installing the power introduction terminal 10 in such a way, the film residues produced in the chamber 61 can be prevented from dropping into, for example, the gap between the rod-like electrical conductor 11 and the insulator 21. As a result, it is possible to prevent the short circuit between the rod-like electrical conductor 11 and the insulator 21 resulting from, for example, the dropping of the film residues produced in the chamber 61.

Figure 6:
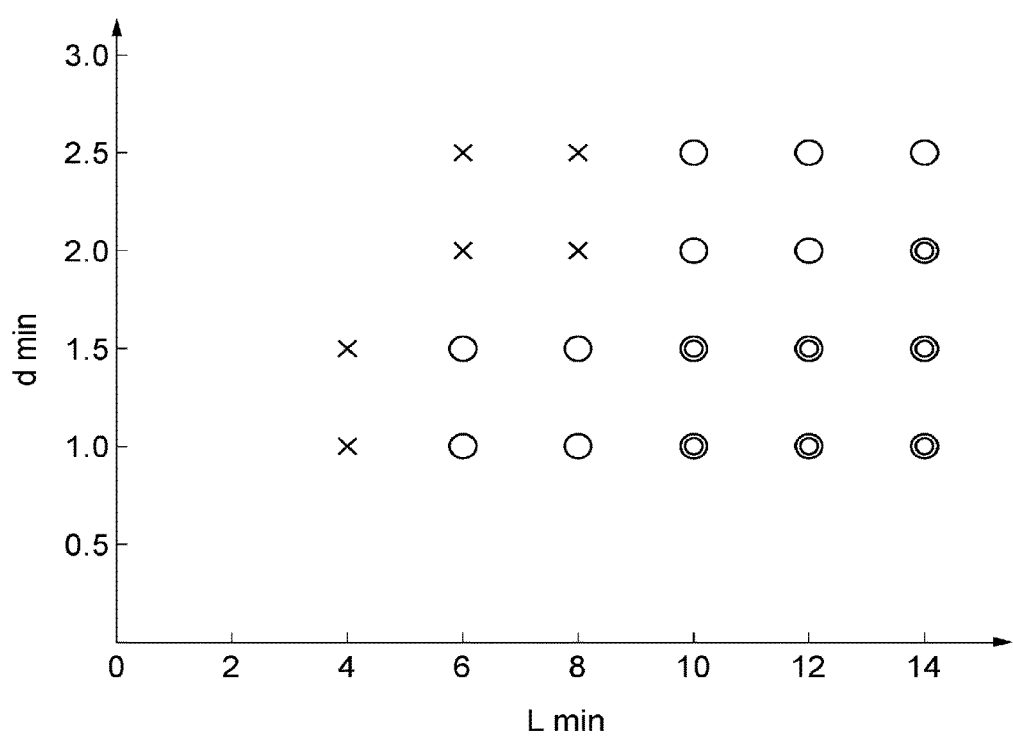
FIG. 6 is a graph showing a result of an experiment for checking the generation of abnormal electrical discharge when plasma CVD processing was performed.

In order to check the generation of abnormal electrical discharge when plasma CVD processing was performed using a high voltage, the following experiment was conducted. FIG. 6 is a graph showing the results of an experiment conducted to check the generation of abnormal electrical discharge when plasma CVD processing was performed. The horizontal axis in FIG. 6 shows the distance L from the contact point 221 to the end surface 21a of the insulator 21 and the vertical axis in FIG. 6 shows the gap d between the rod-like electrical conductor 11 and the inner wall surface 211 of the insulator 21.

In this experiment, the issue of whether or not abnormal electrical discharge was generated after 10,000 cycles was checked under conditions in which a hydrocarbon gas was used as a source gas, the pressure inside the chamber 61 was set to 10 Pa, and bias voltages of 1,000 V-3,000 V were applied. The abnormal electrical discharge in this experiment refers to a state in which there was no stable glow discharge generated at all or a stable glow discharge was not generated for 1 second or longer. In the experiment shown in FIG. 6, the structure of the power introduction terminal 10 shown in FIG. 4 or 5 was not used.

In the graph of FIG. 6, the "double circle" symbol represents that no abnormal electrical discharge was generated even at 3,000 V, the "circle" symbol represents that no abnormal electrical discharge was generated at 1,000 V but that abnormal electrical discharge was generated at 3,000 V, and the "cross" symbol represents that abnormal electrical discharge was generated at 1,000 V.

As shown in FIG. 6, in a state in which the bias voltage of 1,000 V was applied, an abnormal electrical discharge was generated at L=4.0 mm or less, and an abnormal electrical discharge was generated even at L=6.0 mm or 8.0 mm if the gap d was set to d=2.0 mm or greater.

In a state in which the bias voltage of 1,000 V was applied, no abnormal electrical discharge was generated at, for example, L=6.0 mm and d=1.0 mm. However, with such values of L and d, abnormal electrical discharge was generated when the bias voltage of 3,000 V was applied.

Next, in a state in which the bias voltage of 3,000 V was applied, no abnormal electrical discharge was generated at L=10 mm, 12 mm or 14 mm and d=1.5 mm or less, and no abnormal electrical discharge was generated at L=14 mm and d=2.0 mm.

As can be seen from the above experiment results, the generation of abnormal electrical discharge during the plasma CVD processing could be verified to be suppressible for certain distances L and gaps d. As shown in FIG. 6, the structural dimensions of the power introduction terminal 10 are preferably set such that the distance L is greater than 10 mm and the gap d is less than 0.2 mm and, more preferably, the distance L is greater than 14 mm and the gap d is less than 2.0.

Next, in order to check the number of cycles performed before abnormal electrical discharge was generated, the following experiment was conducted using the power introduction terminal 10 shown in FIG. 5. FIG. 7 is a table showing the results of the experiment conducted using the power introduction terminal 10 shown in FIG. 5 and the power introduction terminal 10 shown in FIG. 3 to check the number of cycles performed before abnormal electrical discharge was generated when plasma CVD processing was performed. The experiment shown in FIG. 7 was conducted under conditions in which the bias voltage of 3,000 V was used, the pressure inside the chamber 61 was set to 10 Pa, and the distance L and the gap d were set to L=10 mm (L1=8.0 mm, L2=2.0 mm) and d=2.0 mm, respectively.

As shown in FIG. 7, if no bent part is provided in the power introduction terminal 10 shown in FIG. 3, in other words, if the contact point 221 is provided in an area that opposes the plasma space, the number of cycles before the generation of abnormal electrical discharge was 8,000, whereas, if a bent part was provided in the power introduction terminal 10 shown in FIG. 5, in other words, if the contact point 221 was provided at a position out of the area that opposes the plasma space (area γ in FIG. 5), the number of cycles performed before the generation of abnormal electrical discharge was 20,000 or more. In this way, it was verified that suppression of an abnormal electrical discharge could be more appropriately achieved by providing the contact point 221 at a position out of the area that opposes the plasma space.

The embodiments of the present invention have been described with reference to specific examples. However, the present invention is not limited to those specific examples. Any design modification applied to such specific examples by a person skilled in the art is encompassed in the scope of the present invention, as long as it has the features of the present invention. Each element included in each of the above-mentioned specific examples, as well as the arrangement, materials, conditions, shapes, etc. thereof are not limited to those illustrated in the specific examples and may be arbitrarily changed.

REFERENCE SIGNS LIST

10: power introduction terminal
11: rod-like electrical conductor (electrical conductor)
21: insulator (insulating member)
21a: end surface
22: through hole
61: chamber
61a: wall
62: terminal insertion hole
71: substrate
81: cathode electrode
82: anode electrode
91: gas introduction part
100: plasma CVD apparatus
121: power introduction wire
131: gas introduction pipe
211: inner wall surface (inner wall)
221: contact
311: projected part
321: recessed part
411, 421: bent part

What is claimed is:

1. A plasma CVD apparatus, comprising:
a chamber forming a plasma space; and
a power introduction terminal arranged in a terminal insertion hole that extends through a wall of the chamber, wherein:
the power introduction terminal includes an insulating member having a through hole and an electrical conductor inserted in the through hole;
a first end of the electrical conductor is arranged in the chamber and the other end of the electrical conductor is electrically connected to a power source that supplies power into the chamber;
the through includes a large-diameter through hole and a small-diameter through hole;
a gap between an inner peripheral surface of the large-diameter through hole of the insulating member and the electrical conductor is less than 2 mm;
the electrical conductor includes a projected part that is provided so as to be projected from a surface of the electrical conductor, the projected part being in contact with the inner peripheral surface of the large-diameter through hole of the insulating member;
the inner peripheral surface of the large-diameter through hole of the insulating member is provided with a recessed part that is formed by recessing part of the inner peripheral surface of the large-diameter through hole; and
in a portion at which the projected part and the inner peripheral surface of the large-diameter through hole of the insulating member are in contact with each other, a contact point between the projected part formed inside the chamber and the insulating member is located in the recessed part such that the contact point is not in line-of-sight with a top surface of the insulating member, a distance from one end of the insulating member, said one end of the insulating member being arranged in the plasma space inside the chamber, to the contact point being greater than 10 mm.

* * * * *